United States Patent [19]
Badehi

[11] Patent Number: 6,022,758
[45] Date of Patent: Feb. 8, 2000

[54] PROCESS FOR MANUFACTURING SOLDER LEADS ON A SEMICONDUCTOR DEVICE PACKAGE

[75] Inventor: Pierre Badehi, Mobile Post Harei Yehuda, Israel

[73] Assignee: Shellcase Ltd., Jerusalem, Israel

[21] Appl. No.: 08/765,473

[22] PCT Filed: Jul. 7, 1995

[86] PCT No.: PCT/EP95/02702

§ 371 Date: Feb. 21, 1997

§ 102(e) Date: Feb. 21, 1997

[87] PCT Pub. No.: WO96/02071

PCT Pub. Date: Jan. 25, 1996

[30] Foreign Application Priority Data

Jul. 10, 1994 [IL] Israel ......................................... 110261

[51] Int. Cl.[7] .................................................. H01L 21/60
[52] U.S. Cl. ........................... 438/108; 438/612; 438/613; 438/614; 438/615; 438/617; 438/667; 438/675
[58] Field of Search .................................... 438/108, 614, 438/612, 615, 613, 617, 667, 675

[56] References Cited

U.S. PATENT DOCUMENTS

| | | |
|---|---|---|
| 3,480,841 | 11/1969 | Castrucci et al. . |
| 3,495,324 | 2/1970 | Guthrie et al. . |
| 3,623,961 | 11/1971 | Laer . |
| 3,669,734 | 6/1972 | Jacob . |
| 3,719,981 | 3/1973 | Steitz . |
| 4,067,104 | 1/1978 | Tracey . |
| 4,087,314 | 5/1978 | George et al. . |
| 4,933,305 | 6/1990 | Kikkawa . |
| 5,023,205 | 6/1991 | Reche . |
| 5,104,820 | 4/1992 | Go, Deceased et al. . |
| 5,135,890 | 8/1992 | Temple et al. . |
| 5,171,716 | 12/1992 | Cagan et al. . |
| 5,240,588 | 8/1993 | Uchida . |
| 5,310,965 | 5/1994 | Senba et al. . |
| 5,384,488 | 1/1995 | Golshan et al. . |
| 5,657,206 | 8/1997 | Pedersen et al. . |
| 5,661,087 | 8/1997 | Pedersen et al. . |
| 5,688,721 | 11/1997 | Johnson . |

FOREIGN PATENT DOCUMENTS

| | | |
|---|---|---|
| 514888 | 11/1992 | European Pat. Off. . |
| 3830131 | 4/1989 | Germany . |
| PCT/EP92/ 02134 | 3/1994 | WIPO . |

OTHER PUBLICATIONS

R. Lefort, et al., Flip Chips Imrove Hybrid Capability, Hybrid Circuit Technology, pp. 44–46, May 1990.

Sonic–Mill Processing, Albuquerque, New Mexico, Brochure. Date Not Available.

G. Messner, et al., Multichip Modules, Technical Monograph of the Int'l Society for Hybrid Microelectronics, pp. 68–70. Date Not Available.

Packaging Ideas, Electronic Packaging and Production, Edited by Howard Markstein, May 1992, pp. 25–26.

*Primary Examiner*—David E. Graybill
*Attorney, Agent, or Firm*—Nixon & Vanderhye P.C.

[57] ABSTRACT

A process of forming a packaged integrated circuit by aperturing a discrete packaging layer attached on a silicon substrate. A plurality of solder leads are formed on the layer. Electrical connections are formed from the leads to pads on the substrate.

4 Claims, 9 Drawing Sheets

PROCESS FOR MANUFACTURING SOLDER LEADS ON A SEMICONDUCTOR DEVICE PACKAGE

FIELD OF THE INVENTION

The present invention relates to integrated circuits generally and more particularly to packaged integrated circuits.

BACKGROUND OF THE INVENTION

There are known a great variety of integrated circuits and integrated circuit packaging designs. Published PCT Patent Application PCT/EP92/02134, filed Sep. 14, 1992 which has matured into U.S. patent application Ser. No. 962,222, the disclosure of which is hereby incorporated by reference, of the present assignee describes a particularly advantageous integrated circuit package.

An article entitled "Flip Chips Improve Hybrid Capability by Robert LeFort et al in Hybrid Circuit Technology, May 1990 pp. 44–46 describes packaged integrated circuits known as Flip Chips, which are formed with a multiplicity of solder bumps on a planar surface thereof for flat mounting onto a circuit board.

It has been proposed in Electronic Packaging & Production, May 1992 at pages 25 and 26 to mount a Flip Chip onto a ball-grid array having a fan-out of conductors, extending through plated through apertures, and leading to an array of solder bumps.

SUMMARY OF THE INVENTION

The present invention seeks to provide an improved packaged integrated circuit.

There is thus provided in accordance with a preferred embodiment of the present invention a packaged integrated circuit including:

a silicon substrate;

at least one metal layer formed on the silicon substrate and defining a plurality of pads;

at least one packaging layer formed over the at least one metal layer;

a plurality of solder leads formed on an exterior surface of the at least one packaging layer; and electrical connections extending directly from individual ones of the plurality of pads to individual ones of solder leads.

Preferably, the electrical connections extend transversely to the package layer.

In accordance with a preferred embodiment of the present invention, the electrical connections are formed by conventional metal deposition and plating techniques following attachment of the packaging layer to the substrate.

There is also provided in accordance with a preferred embodiment of the present invention a method of forming a packaged integrated circuit comprising:

providing a silicon substrate;

forming at least one metal layer onto the silicon substrate including a plurality of pads;

attaching at least one packaging layer over the at least one metal layer;

forming a plurality of solder leads on an exterior surface of the at least one packaging layer; and forming electrical connections directly from individual ones of the plurality of pads to individual ones of solder leads.

In accordance with a preferred embodiment of the present invention, the electrical connections are formed by conventional metal deposition and plating techniques following attachment of the packaging layer to the substrate.

The foregoing steps may be carried out waferwise or diewise.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1A:
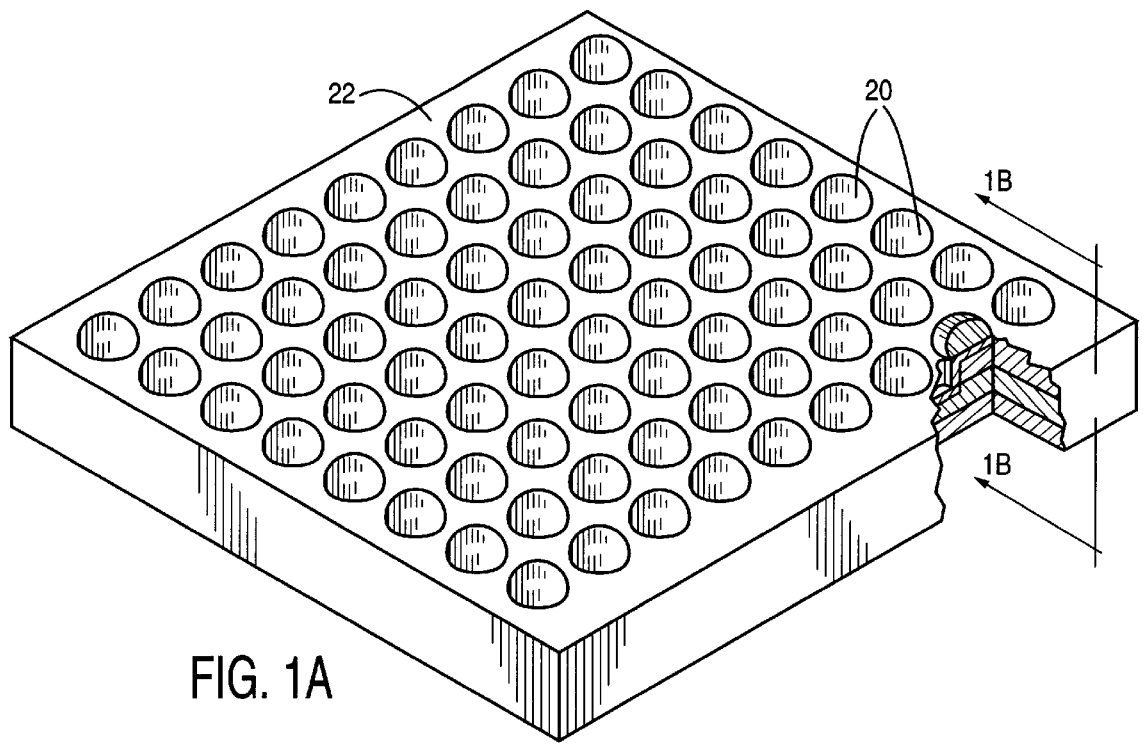
FIG. 1A is a partially cut away simplified illustration of an integrated circuit package constructed in accordance with a preferred embodiment of the present invention.
Figure 1B:
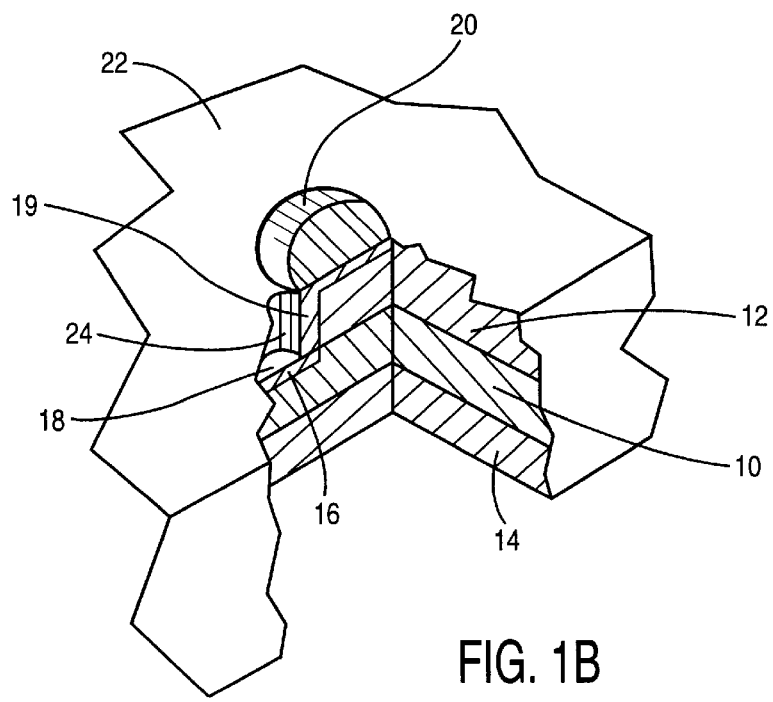
FIG. 1B is a partial sectional simplified illustration of the internal structure of the integrated circuit package shown in FIG. 1A.

Reference is now made to FIGS. 1A and 1B, which illustrate an integrated circuit package constructed and operative in accordance with a preferred embodiment of the present invention.

The illustrated embodiment comprises a silicon substrate 10 which is sandwiched between at least a pair of electrically insulative packaging layers 12 and 14. In accordance with a preferred embodiment of the present invention, at least one metal layer 16 is formed on the silicon substrate and defines a plurality of pads, one of which is indicated by reference numeral 18.

In accordance with a preferred embodiment of the present invention, a direct electrical connection 19 is formed between each of a plurality of pads 18 and a corresponding solder lead, typically in the form of a solder bump 20, formed on a planar surface 22 of the integrated circuit package.

Preferably, the direct electrical connection 19 extends through an aperture 24 formed in one or more insulating layers 12 and extending directly from the pad to the planar surface 22. The solder bump 20 is typically disposed immediately adjacent to the aperture 24. Aperture 24 is preferably a completely or partially plated through aperture.

It is a particular feature of the present invention that the electrical connection 19 traverses substantially the shortest available path between each pad 18 and its corresponding solder bump 20 and extends transversely to surface, directly upwardly from pad 18.

Reference is now made to FIGS. 2A–2G, which are sectional illustrations of the steps of a preferred method of waferwise manufacture of the integrated circuit package of FIGS. 1A and 1B.

Figure 2A:
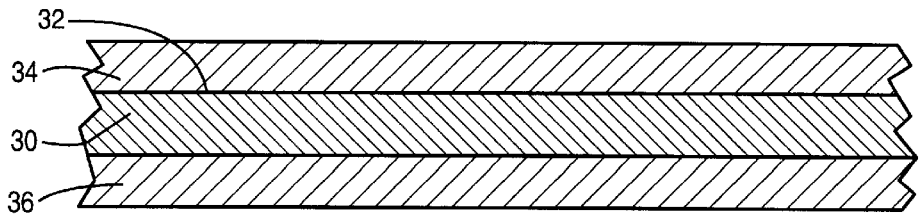
FIGS. 2A–2G are sectional illustrations of the steps of a preferred method of waferwise manufacture of the integrated circuit package of FIGS. 1A and 1B.
Figure 2B:
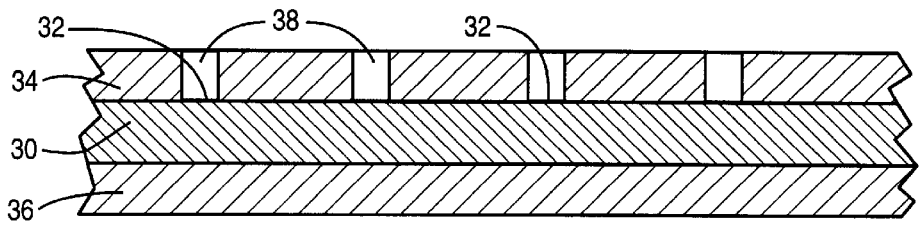

FIG. 2A illustrates a silicon wafer 30 having one or more metal layers formed thereon defining pads 32, which is sandwiched between insulative layers 34 and 36, which adhere thereto. A plurality of apertures 38 are formed, as by drilling, in insulative layer 34, in registration over corresponding pads 32, as shown in FIG. 2B.

Figure 2C:
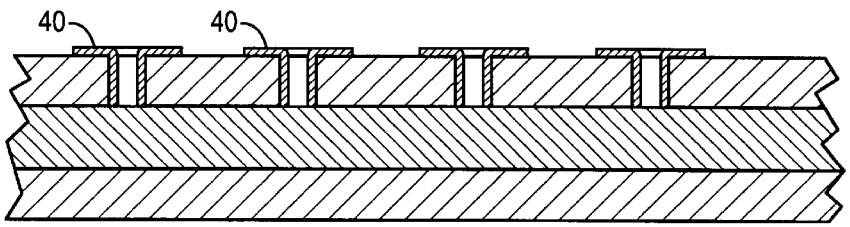
Figure 2D:
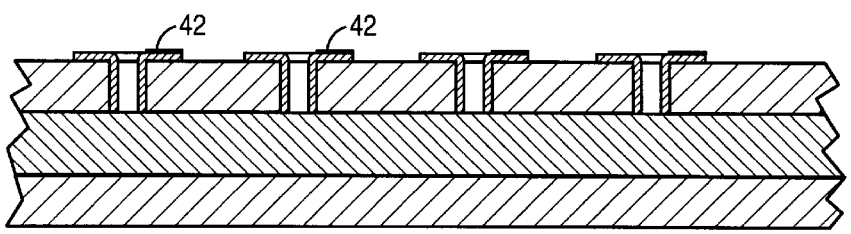
Figure 2E:
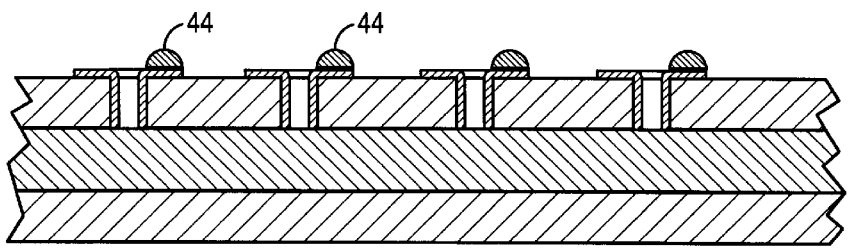

As seen in FIG. 2C, the apertures are then plated, using conventional lithographic and metal deposition techniques, to define an electrical connection 40. Thereafter, as illustrated in FIG. 2D, a layer 42 of electroless gold or electroless nickel is plated onto a location adjacent each aperture to serve as a base for a solder bump. A solder bump 44 is formed over each layer 42, as seen in FIG. 2E.

Figure 2F:
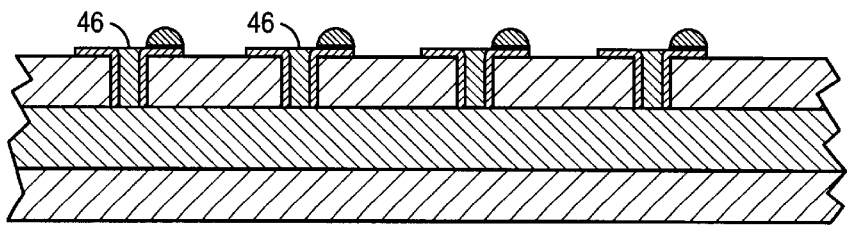
Figure 2G:
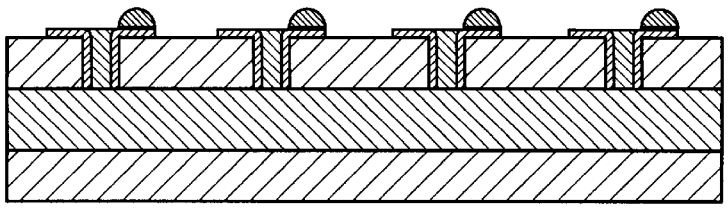

Apertures 38 are then filled with a filler 46, such as epoxy adhesive, as seen in FIG. 2F and the wafer is then diced, as shown in FIG. 2G.

Reference is now made to FIGS. 3A–3G, which are sectional illustrations of the steps of another preferred method of waferwise manufacture of the integrated circuit package of FIGS. 1A and 1B.

Figure 3A:
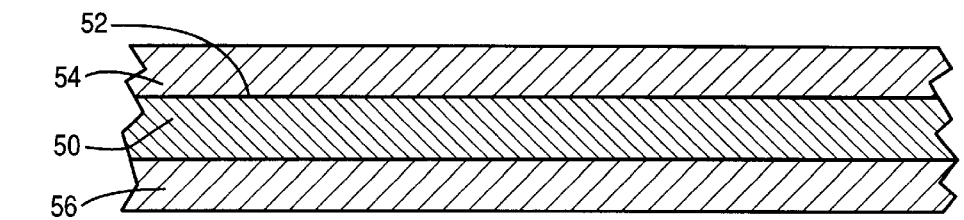
FIGS. 3A–3G are sectional illustrations of the steps of another preferred method of waferwise manufacture of the integrated circuit package of FIGS. 1A and 1B.
Figure 3B:
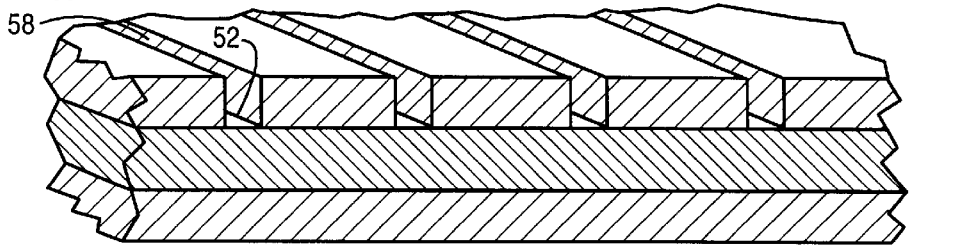

FIG. 3A, similarly to FIG. 2A, illustrates a silicon wafer 50 having one or more metal layers formed thereon defining pads 52, which is sandwiched between insulative layers 54 and 56, which adhere thereto. A plurality of slits 58 are formed, as by milling, in insulative layer 54, in registration over corresponding pads 52, as shown in FIG. 3B. Milling may advantageously be carried out using sonic milling techniques, employing equipment commercially available from Sonic-Mill, Division of RGA, Inc., 3820 Academy Parkway North, N.E., Albuquerque, N.M. 87109, U.S.A.

Figure 3C:
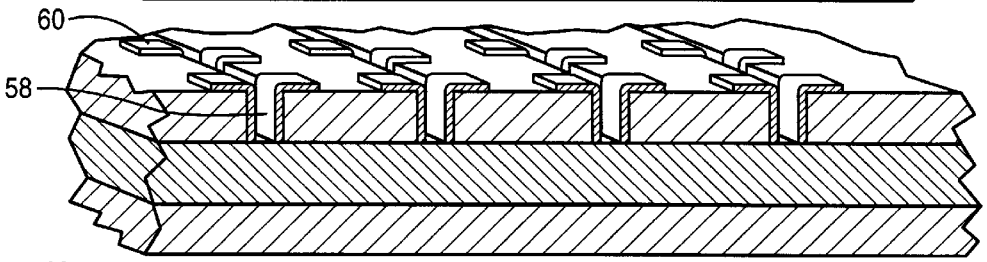
Figure 3D:
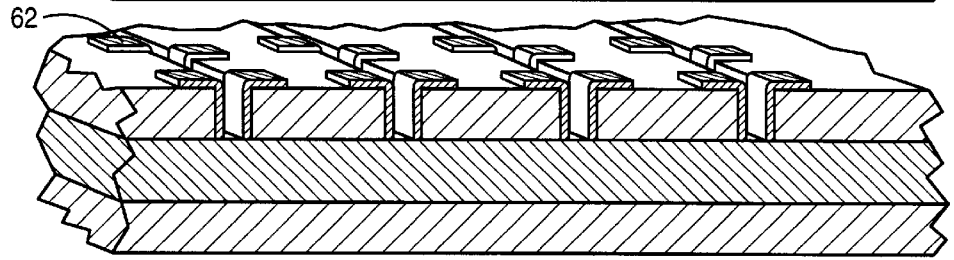
Figure 3E:
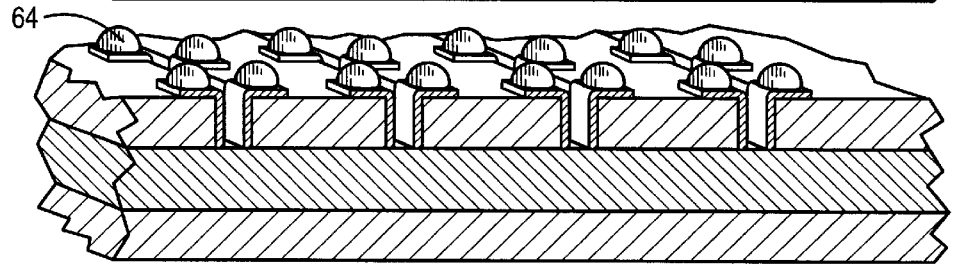

As seen in FIG. 3C, the slits 58 are then plated, using conventional lithographic and metal deposition techniques, to define a plurality of electrical connections 60. Thereafter, as illustrated in FIG. 3D, a layer 62 of electroless gold or electroless nickel is plated onto a location adjacent on each electrical connection 60 to serve as a base for a solder bump. A solder bump 64 is formed over each layer 62, as seen in FIG. 3E.

Figure 3F:
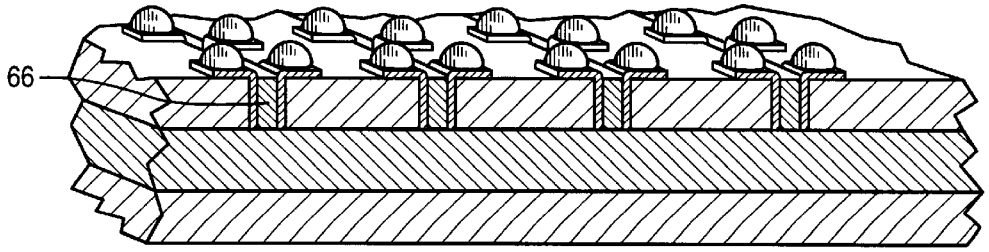
Figure 3G:
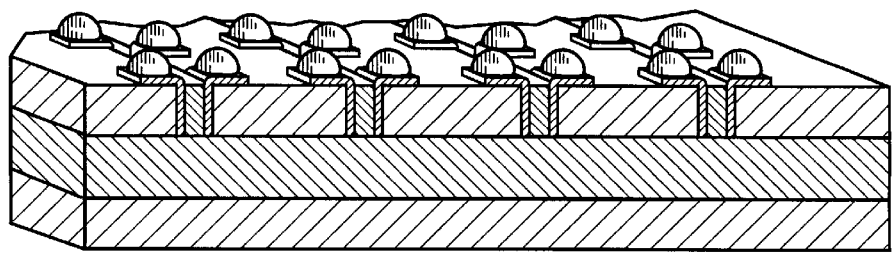

Slits 58 are then filled with a filler 66, such as epoxy, as seen in FIG. 3F and the wafer is then diced, as shown in FIG. 3G.

Although the above description has included a pair of insulative layers 34 and 36, without a loss in generality, the above method is also applicable to a silicon wafer 30 with the single insulative layer 34.

Figure 4A:
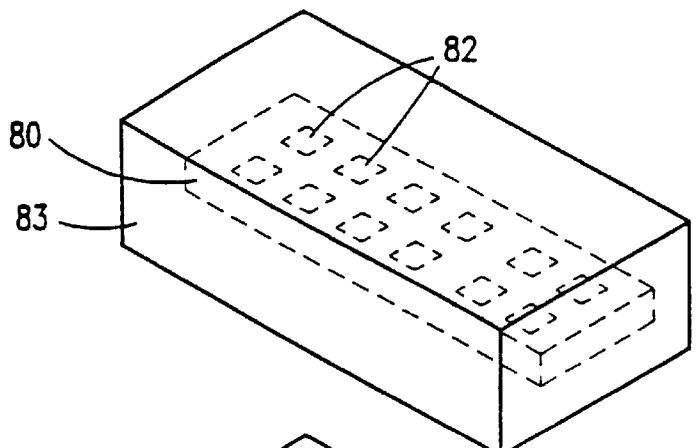
FIGS. 4A and 4B are illustrations of certain steps in a preferred method of non-waferwise manufacture of the integrated circuit package of FIGS. 1A and 1B.
Figure 4B:
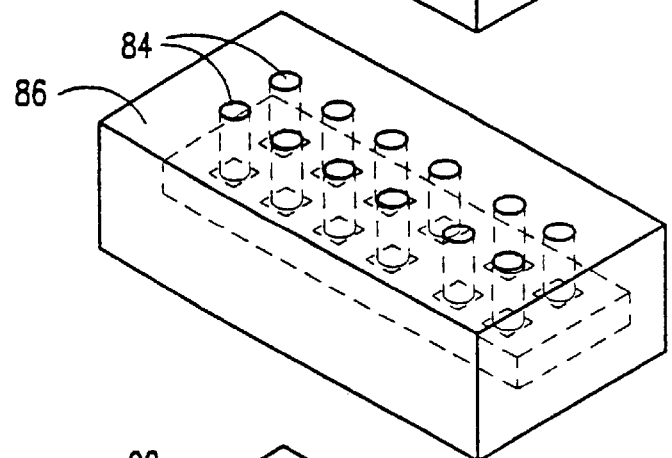

Reference is now made to FIGS. 4A and 4B, which are illustrations of certain steps in a preferred method of non-waferwise manufacture of the integrated circuit package of FIGS. 1A and 1B. Here, a die 80, having formed thereon at least one metal layer defining pads, including a pad 82, is surrounded by insulative material 83 on all sides. Apertures 84 are formed as by drilling above each pad 82, thus providing direct communication between the pad 82 and an outer planar surface 86 of the package.

Figure 5A:
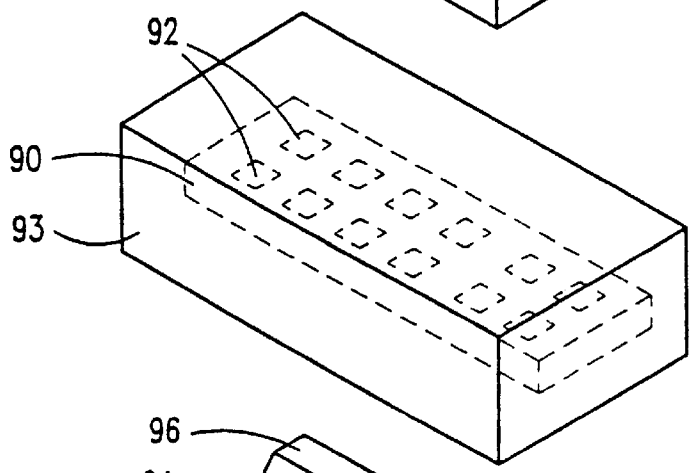
FIGS. 5A and 5B are illustrations of certain steps in another preferred method of non-waferwise manufacture of the integrated circuit package of FIGS. 1A and 1B.
Figure 5B:
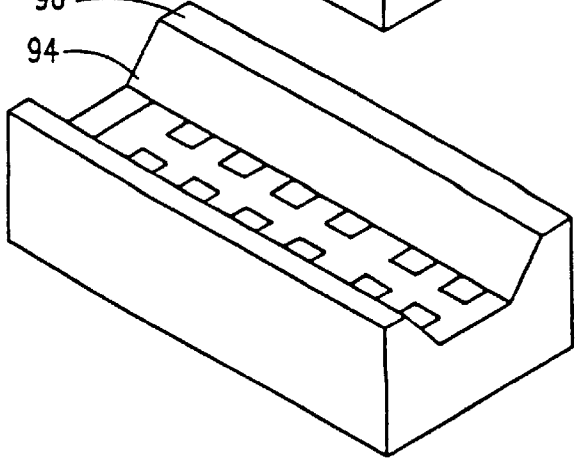

Reference is now made to FIGS. 5A and 5B, which are illustrations of certain steps in another preferred method of non-waferwise manufacture of the integrated circuit package of FIGS. 1A and 1B. Here, a die 90, having formed thereon at least one metal layer defining pads, including a pad 92, is surrounded by insulative material 93 on all sides. A slit 94 is formed as by sonic milling above pads 92, thus providing direct communication between the pads 92 and an outer planar surface 96 of the package.

Figure 6:
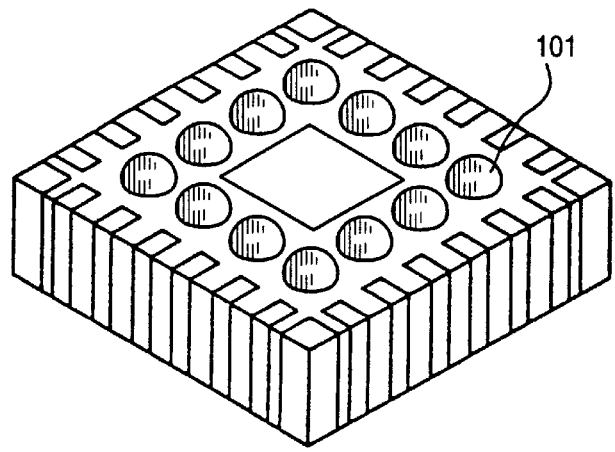
FIG. 6 is a simplified illustration of a finished integrated circuit package constructed and operative in accordance with another embodiment of the present invention.
Figure 7A:
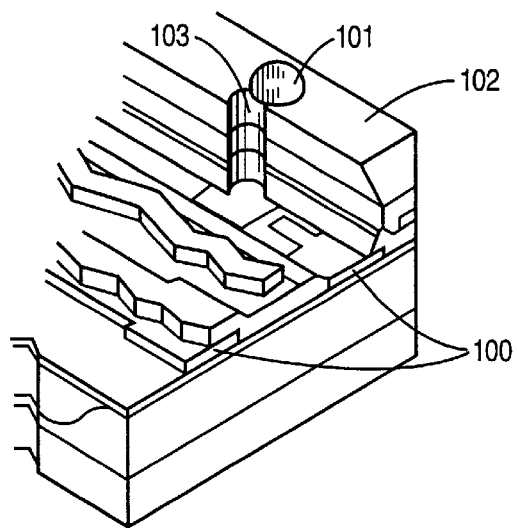
FIGS. 7A and 7B are simplified partially cut away illustrations of a partially completed integrated circuit package of the type shown in FIG. 6, in accordance with two alternative embodiments of the present invention.
Figure 7B:
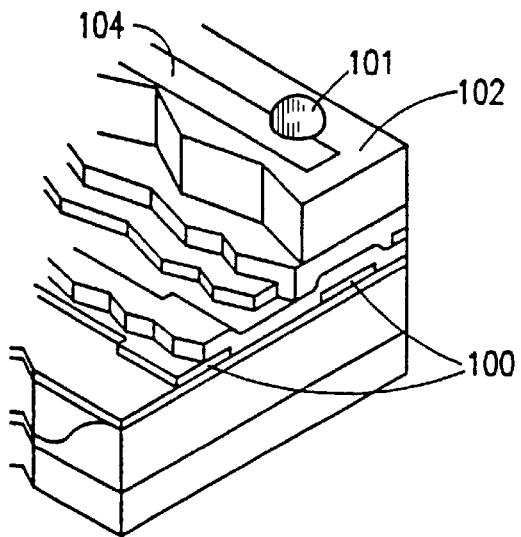

Reference is now made to FIG. 6, which is a simplified illustration of a finished integrated circuit package constructed and operative in accordance with another embodiment of the present invention and to FIGS. 7A and 7B, which are simplified partially cut away illustrations of a partially completed integrated circuit package of the type shown in FIG. 6, in accordance with two alternative embodiments of the present invention.

The embodiment of FIG. 6 is of the type described and claimed in applicant/assignee's published PCT Patent Application PCT/EP92/02134, filed Sep. 14, 1992 which has matured into U.S. patent application Ser. No. 962,222, the disclosure of which is hereby incorporated by reference. FIG. 7A shows how direct electrical connections can be made between pads 100 and solder bumps 101 disposed on a planar surface 102 of the package by employing apertures 103. FIG. 7B shows how direct electrical connections can be made between pads 100 and solder bumps 101 disposed on a planar surface 102 of the package by employing slits 104.

Figure 8A:
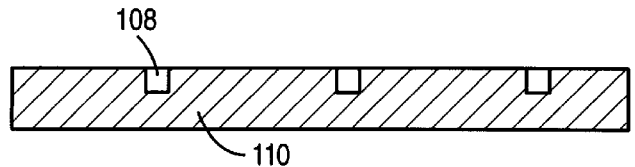
FIGS. 8A–8C illustrate three stages in the manufacture of an integrated circuit package in accordance with one embodiment of the present invention.
Figure 8B:
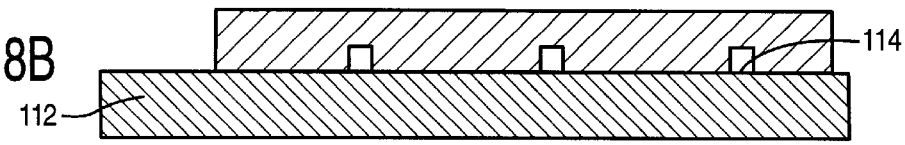
Figure 8C:
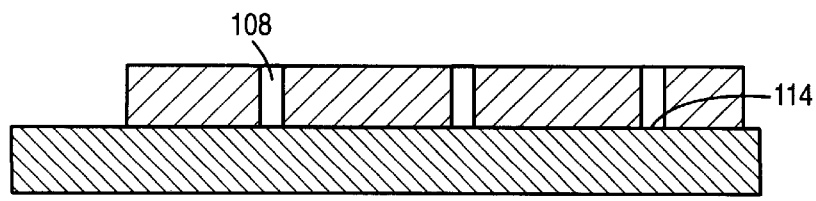

Reference is now made to FIGS. 8A–8C, which illustrate three stages in the manufacture of an integrated circuit package in accordance with one embodiment of the present invention. As shown in FIG. 8A, apertures 108 are formed in a discrete insulating layer 110, by drilling or any other suitable technique. Preferably the apertures 108 do not extend entirely through the layer 110. The apertures may be made, for example by coring, plasma material removal, etching or the use of other chemical materials.

As seen in FIG. 8B, the layer 110 is bonded to a silicon substrate 112 having pads 114. The apertures 108 are then completed, by drilling or otherwise, down to the pads 114, as shown in FIG. 8C.

Figure 9A:
FIGS. 9A and 9B illustrate two stages in the manufacture of an integrated circuit package in accordance with another embodiment of the present invention.
Figure 9B:
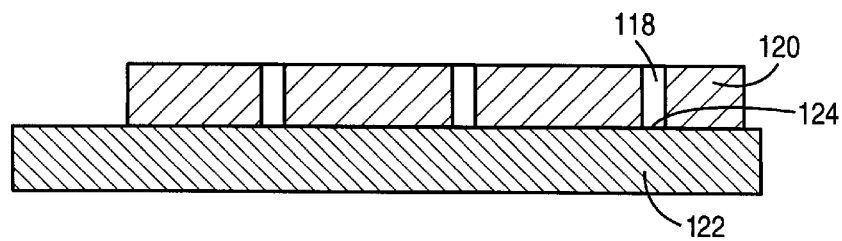

Reference is now made to FIGS. 9A and 9B, which illustrate two stages in the manufacture of an integrated circuit package in accordance with another embodiment of the present invention, similar to that of FIGS. 8A–8C. As shown in FIG. 9A, apertures 118 are formed in a discrete insulating layer 120, by drilling or any other suitable technique. Here, apertures 118 do extend entirely through the layer 120.

As seen in FIG. 9B, the layer 120 is turned upside down and bonded to a silicon substrate 122 having pads 124, such that the apertures 118 communicate with pads 124.

Figure 10A:
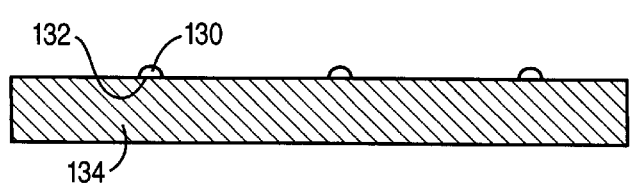
FIGS. 10A–10C illustrated three stages in the manufacture of an integrated circuit package in accordance with yet another embodiment of the present invention.
Figure 10B:
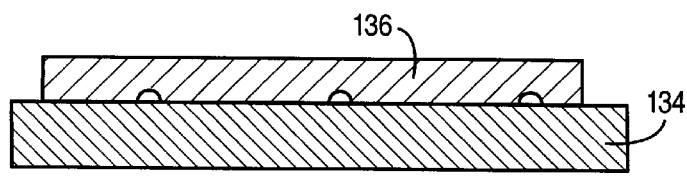
Figure 10C:
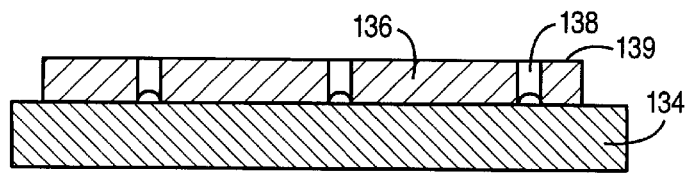

Reference is now made to FIGS. 10A–10C, which illustrate three stages in the manufacture of an integrated circuit package in accordance with yet another embodiment of the present invention. As shown in FIG. 10A, bumps 130 of metal, such as tin, gold, copper or aluminum are formed at spaced locations on pads 132 formed on a silicon substrate 134. As shown in FIG. 10B, an insulating layer 136 is formed over the silicon substrate 134. Thereafter, as shown in FIG. 10C, apertures 138 are formed by drilling or other techniques, such as those mentioned above, in layer 136, extending perpendicular to the plane of silicon substrate 134 and leading directly to a top surface 138 of layer 136.

Figure 11:
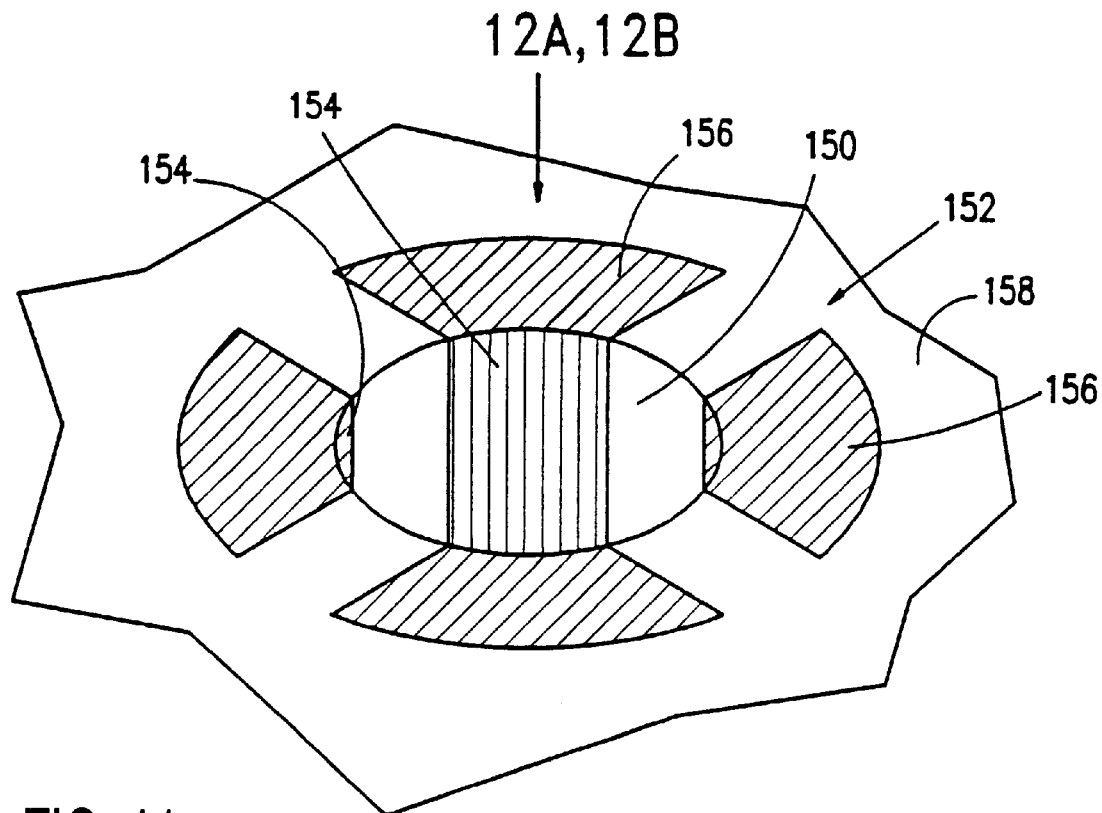
FIG. 11 is an illustration of a multi-conductor plated through aperture useful in the present invention.

Reference is now made to FIG. 11, which is an illustration of a multi-conductor plated through aperture useful in the present invention. As seen in FIG. 11, an aperture 150 is formed in an insulative layer 152. A plurality of conductive paths 154 are plated through the aperture, each having a top surface portion 156 on a top surface 158 of layer 152.

Figure 12A:
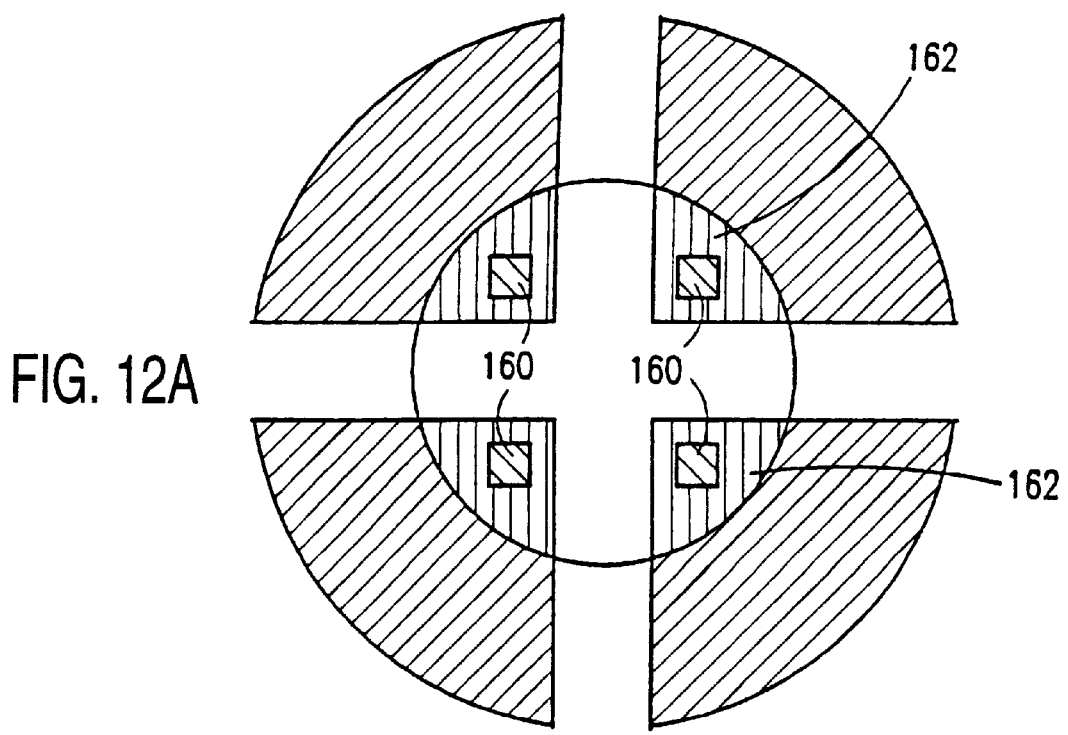
FIGS. 12A and 12B are illustrations of two alternative configurations of the plated through aperture of FIG. 11.
Figure 12B:
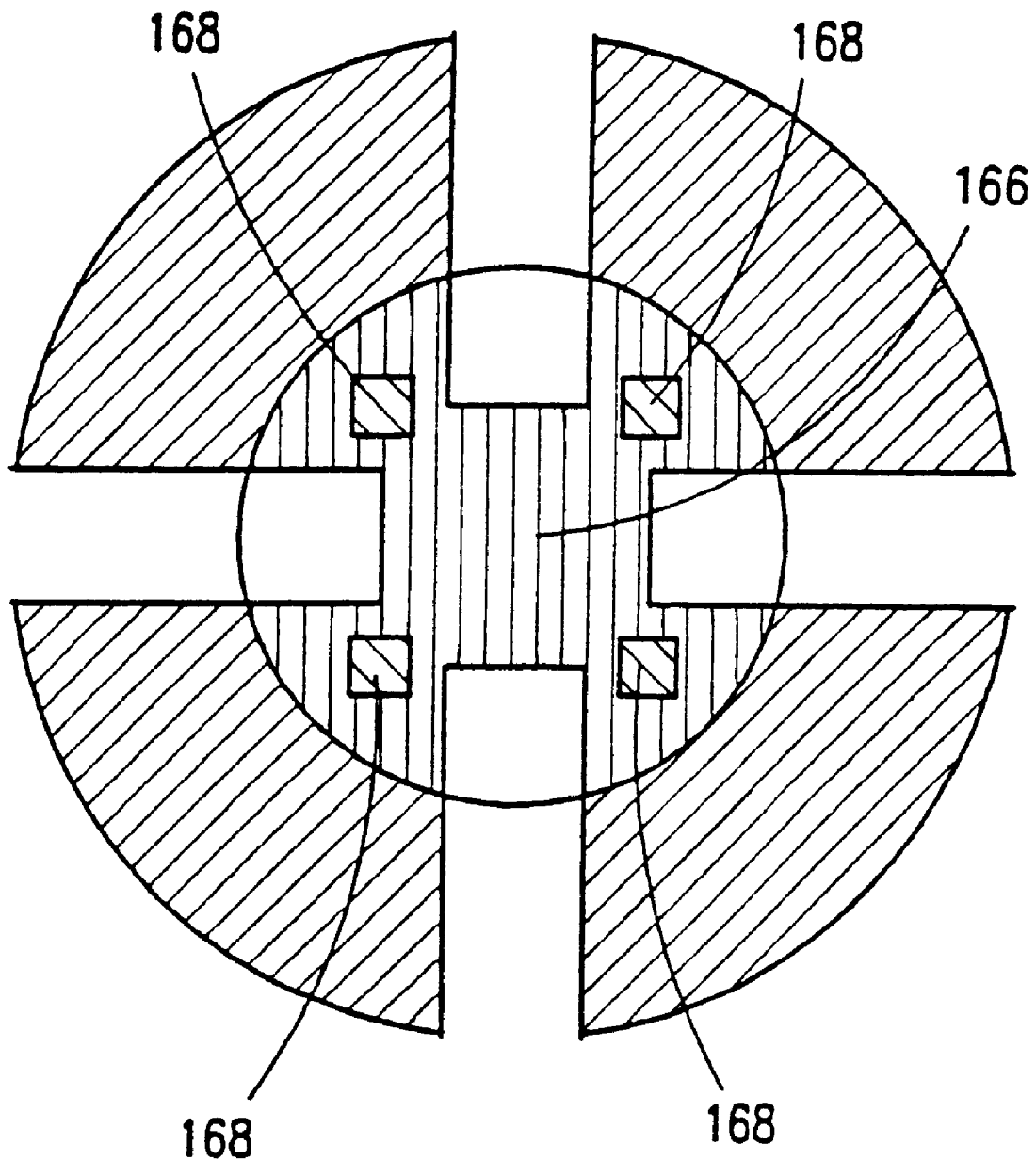

FIGS. 12A and 12B are illustrations of two alternative configurations of the base of the plated through aperture of FIG. 11. FIG. 12A shows an embodiment wherein the conductive paths 154 are separate and mutually insulated from each other. Each conductive path communicates with a separate pad 160 on an underlying silicon substrate, via a bottom surface portion 162 of the conductive path 154.

FIG. 12B shows an embodiment wherein the conductive paths 154 are joined and electrically shorted to each other. A common bottom surface portion 166 communicates with each conductive path and with separate pads 168 on an underlying silicon substrate.

Figure 13A:
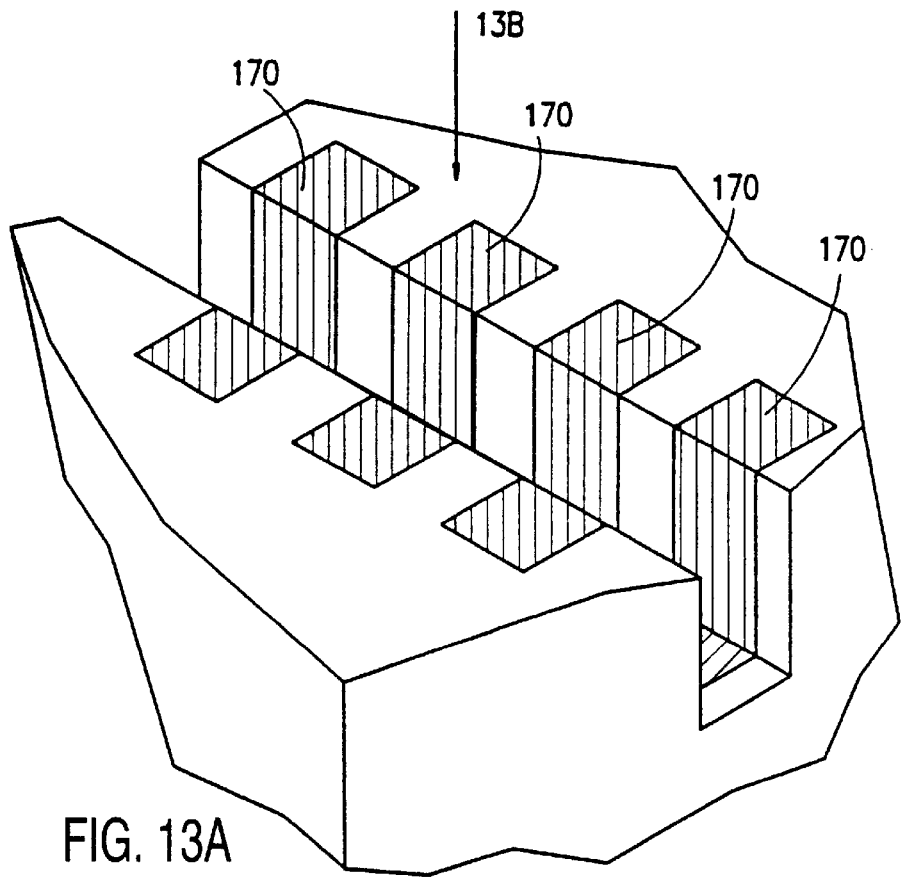
FIGS. 13A and 13B are illustrations of a multi-conductor plated groove useful in the present invention.
Figure 13B:
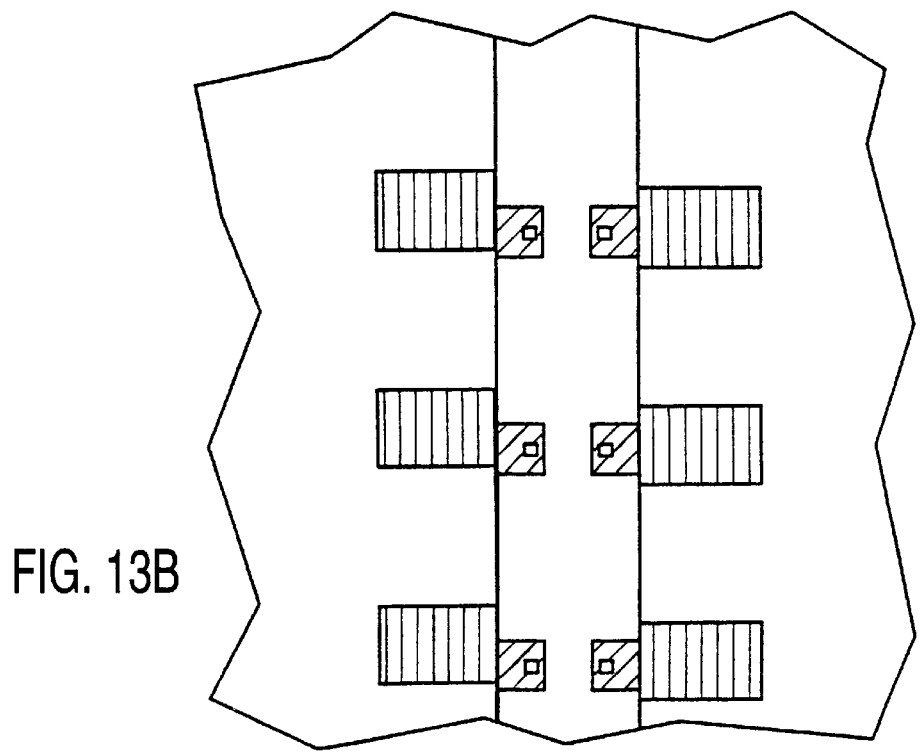

Reference is now made to FIGS. 13A and 13B are illustrations of a multi-conductor plated groove useful in the present invention defining multiple electrical paths 170.

It will be appreciated by persons skilled in the art that the present invention is not limited by what has been particularly shown and described hereinabove, but is intended to include variations and modifications thereof. Rather the scope of the present invention is defined only by the claims which follow:

I claim:

1. A method of forming a packaged integrated circuit comprising:

providing a silicon substrate;

forming at least one metal layer onto said silicon substrate including a plurality of pads;

providing a discrete packaging layer;

aperturing the discrete packaging layer to provide an apertured discrete packaging layer having apertures located in locations corresponding to locations of said plurality of pads;

attaching said apertured discrete packaging layer over said at least one metal layer so that said apertures communicate with said pads;

forming a plurality of solder leads on an exterior surface of said at least one packaging layer; and forming electrical connections directly from individual ones of said plurality of pads to individual ones of said solder leads.

2. A method according to claim 1 and wherein said electrical connections are formed following attachment of said at least one packaging layer to said substrate.

3. A method according to claim 1 and wherein said steps of:

forming at least one metal layer, attaching at least one packaging layer over said at least one metal layer, forming a plurality of solder leads on an exterior surface of said at least one packaging layer and forming electrical connections directly from individual ones of said plurality of pads to individual ones of solder leads are carried out waferwise.

4. A method according to claim 1 and wherein said steps of:

forming at least one metal layer, attaching at least one packaging layer over said at least one metal layer, forming a plurality of solder leads on an exterior surface of said at least one packaging layer and forming electrical connections directly from individual ones of said plurality of pads to individual ones of solder leads are carried out diewise.

* * * * *